(12) United States Patent
Nagai (10) Patent No.: US 9,654,097 B2
(45) Date of Patent: May 16, 2017

(54) SIGNAL TRANSMISSION CIRCUIT, SWITCHING SYSTEM, AND MATRIX CONVERTER

(71) Applicant: Panasonic Intellectual Property Management Co., Ltd., Osaka (JP)

(72) Inventor: Shuichi Nagai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 308 days.

(21) Appl. No.: 14/597,296

(22) Filed: Jan. 15, 2015

(65) Prior Publication Data

US 2015/0214852 A1   Jul. 30, 2015

(30) Foreign Application Priority Data

Jan. 29, 2014 (JP) ................ 2014-014499

(51) Int. Cl.
| | |
|---|---|
| *H02M 5/293* | (2006.01) |
| *H03K 17/687* | (2006.01) |
| *H02M 5/297* | (2006.01) |
| *H01L 27/02* | (2006.01) |

(52) U.S. Cl.
CPC .......... *H03K 17/687* (2013.01); *H02M 5/297* (2013.01); *H01L 27/0248* (2013.01)

(58) Field of Classification Search
CPC .................................................. H02M 5/293
USPC .......... 318/800, 799, 798, 767, 727
See application file for complete search history.

(56) References Cited

U.S. PATENT DOCUMENTS

| | | | |
|---|---|---|---|
| 5,736,774 A | 4/1998 | Fujihira | |
| 8,836,747 B2 * | 9/2014 | Harris | G03G 15/04072 347/231 |
| 2010/0097105 A1 | 4/2010 | Morita et al. | |
| 2011/0204807 A1 | 8/2011 | Hashizume et al. | |
| 2014/0049297 A1 | 2/2014 | Nagai et al. | |

FOREIGN PATENT DOCUMENTS

| | | |
|---|---|---|
| JP | 59-169390 | 9/1984 |
| JP | 7-087739 | 3/1995 |
| JP | 2002-026708 | 1/2002 |
| JP | 2005-124322 | 5/2005 |

(Continued)

*Primary Examiner* — David S Luo
(74) *Attorney, Agent, or Firm* — McDermott Will & Emery LLP (57) ABSTRACT

A signal transmission circuit includes an input terminal to which an input signal is input, a high-frequency oscillation circuit that outputs a high-frequency wave, a switching mixing circuit that modulates the high-frequency wave according to the input signal to generate modulated signals including first to third modulated signals, a first output terminal from which the first modulated signal is output, a second output terminal from which the second modulated signal is output, and a third output terminal from which the third modulated signal is output. While the first modulated signal is output from the first output terminal, the second and third modulated signals are not output. While the second modulated signal is output from the second output terminal, the first and third modulated signals are not output. While the third modulated signal is output from the third output terminal, the first and second modulated signals are not output.

19 Claims, 9 Drawing Sheets

(56) References Cited

FOREIGN PATENT DOCUMENTS

| JP | 2008-067012 | 3/2008 |
|---|---|---|
| JP | 2011-176921 | 9/2011 |
| JP | 2011-228946 | 11/2011 |
| WO | 2008/062800 | 5/2008 |
| WO | 2013/065254 | 5/2013 |
| WO | 2013/145019 | 10/2013 |

\* cited by examiner

SIGNAL TRANSMISSION CIRCUIT, SWITCHING SYSTEM, AND MATRIX CONVERTER

CROSS REFERENCES TO RELATED APPLICATIONS

This application claims priority to Japanese Patent Application No. 2014-014499, filed on Jan. 29, 2014, the contents of which are hereby incorporated by reference.

BACKGROUND

1. Technical Field

The present disclosure relates to, for example, a signal transmission circuit, a switching system, and a matrix converter.

2. Description of the Related Art

A gate drive circuit applies a gate voltage to a gate terminal of a semiconductor switch and performs on-off control of a semiconductor switch. The gate drive circuit applies the gate voltage to the gate terminal of the semiconductor switch, which has high withstand voltage characteristics.

Japanese Patent No. 5552230 discloses a bidirectional switch for which a gallium nitride (GaN) semiconductor is used. The bidirectional switch may allow a current to flow in both directions between two terminals when turned on, and may interrupt the bidirectional current when turned off.

An element that insulates a direct current (DC) component between a primary side and a secondary side is referred to as a signal insulator or a non-contact signal transmitter. The signal insulator is indispensable to drive the semiconductor switch with high withstand voltage characteristics.

Japanese Unexamined Patent Application Publication No. 2008-067012 discloses an open-ring type electromagnetic resonance coupler capable of isolatedly transmitting a gate signal and power.

SUMMARY

One non-restricting and exemplary embodiment provides reduction in consumption of power used for signal outputs.

Additional benefits and advantages of the disclosed embodiments will be apparent from the specification and drawings. The benefits and/or advantages may be individually provided by the various embodiments and features of the specification and drawings disclosure, and need not all be provided in order to obtain one or more of the same.

A signal transmission circuit according to an aspect of the present disclosure includes: at least one input terminal to which at least one input signal is input; a high-frequency oscillation circuit that outputs a high-frequency wave; a switching mixing circuit that modulates the high-frequency wave according to the at least one input signal to generate a plurality of modulated signals including a first modulated signal, a second modulated signal, and a third modulated signal; a first output terminal from which the first modulated signal is output; a second output terminal from which the second modulated signal is output; and a third output terminal from which the third modulated signal is output. In the signal transmission circuit, while the first modulated signal is output from the first output terminal, the second modulated signal and the third modulated signal are not output, while the second modulated signal is output from the second output terminal, the first modulated signal and the third modulated signal are not output, and while the third modulated signal is output from the third output terminal, the first modulated signal and the second modulated signal are not output.

According to the present disclosure, for example, the consumption of power used for signal outputs can be reduced.

These comprehensive and specific aspects may be implemented using a system, a method, and a computer program, and any combination of systems, methods, and computer programs.

DETAILED DESCRIPTION

Overview of Embodiments

A signal transmission circuit according to an aspect of the present disclosure includes: at least one input terminal to which at least one input signal is input; a high-frequency oscillation circuit that outputs a high-frequency wave; a switching mixing circuit that modulates the high-frequency wave according to the at least one input signal to generate a plurality of modulated signals including a first modulated signal, a second modulated signal, and a third modulated signal; a first output terminal from which the first modulated signal is output; a second output terminal from which the second modulated signal is output; and a third output terminal from which the third modulated signal is output. In the signal transmission circuit, while the first modulated signal is output from the first output terminal, the second modulated signal and the third modulated signal are not output, while the second modulated signal is output from the second output terminal, the first modulated signal and the third modulated signal are not output, and while the third modulated signal is output from the third output terminal, the first modulated signal and the second modulated signal are not output.

The above-described configuration enables the signal transmission circuit to output three or more modulated signals. Accordingly, for example, power of one power supply may be allocated to a plurality of modulated signals. In this case, power consumption can be reduced. When one of a first modulated signal, a second modulated signal, and a third modulated signal is output, the other two modulated signals are not output. This enables the strength of the output signal to be maintained.

In the signal transmission circuit according to an aspect of the present disclosure, for example, the high-frequency wave may be a high-frequency sinusoidal wave.

Accordingly, for example, even when signal transmission circuit includes an insulator that transmits a high-frequency wave with a certain frequency, the high-frequency sinusoidal wave can transfer the input signal through the insulator.

For example, the signal transmission circuit according to an aspect of the present disclosure may further include: a first insulator that isolatedly transmits the first modulated signal, the first insulator coupled to the first output terminal; a second insulator that isolatedly transmits the second modulated signal, the second insulator coupled to the second output terminal; and a third insulator that isolatedly transmits the third modulated signal, the third insulator coupled to the third output terminal.

In the signal transmission circuit according to an aspect of the present disclosure, for example, the first insulator may be a first electromagnetic resonance coupler, the second insulator may be a second electromagnetic resonance coupler, and the third insulator may be a third electromagnetic resonance coupler.

The electromagnetic resonance coupler can be driven with high withstand voltage, high-speed operation, and/or high efficiency.

In the signal transmission circuit according to an aspect of the present disclosure, for example, the at least one input signal may include a first input signal, a second input signal, and a third input signal, and the at least one input terminal includes a first input terminal to which the first input signal is input, a second input terminal to which the second input signal is input, and a third input terminal to which the third input signal is input, the switching mixing circuit may modulate the high-frequency wave according to the first input signal to generate the first modulated signal, may modulate the high-frequency wave according to the second input signal to generate the second modulated signal, and may modulate the high-frequency wave according to the third input signal to generate the third modulated signal.

In the signal transmission circuit according to an aspect of the present disclosure, for example, while the first input signal is input from the first input terminal, a signal may be input to neither the second input terminal nor the third input terminal, while the second input signal is input from the second input terminal, a signal may be input to neither the first input terminal nor the third input terminal, and while the third input signal is input from the third input terminal, a signal may be input to neither the first input terminal nor the second input terminal.

For example, when three input signals that are mutually exclusive are input to the signal transmission circuit, modulated signals that are mutually exclusive are output accordingly.

In the signal transmission circuit according to an aspect of the present disclosure, for example, the switching mixing circuit may include a high-frequency input terminal to which the high-frequency wave is input from the high-frequency oscillation circuit; a power-supply terminal from which a power-supply potential is applied; a ground terminal from which a ground potential is applied; a first transistor that includes a first gate terminal coupled to the high-frequency input terminal, a first source terminal coupled to the ground terminal, and a first drain terminal; a second transistor that includes a second gate terminal coupled to a first input terminal, a second source terminal coupled to the first drain terminal of the first transistor, and a second drain terminal coupled to the first output terminal and the power-supply terminal; a third transistor that includes a third gate terminal coupled to a second input terminal, a third source terminal coupled to the first drain terminal of the first transistor, and a third drain terminal coupled to the second output terminal and the power-supply terminal; and a fourth transistor that includes a fourth gate terminal coupled to a third input terminal, a fourth source terminal coupled to the first drain terminal of the first transistor, and a fourth drain terminal coupled to the third output terminal and the power-supply terminal.

The above-described configuration can simplify the switching mixing circuit. As a result, the signal transmission circuit can be downsized.

For example, a switching system according to an aspect of the present disclosure includes: the above-described signal transmission circuit; a first reception circuit that demodulates a first modulated signal received from the first insulator to generate a first gate signal, the first reception circuit coupled to the first insulator; a second reception circuit that demodulates a second modulated signal received from the second insulator to generate a second gate signal, the second reception circuit coupled to the second insulator; a third reception circuit that demodulates a third modulated signal received from the third insulator to generate a third gate signal, the third reception circuit coupled to the third insulator; a first power device that is driven according to the first gate signal, the first power device coupled to the first reception circuit; a second power device that is driven according to the second gate signal, the second power device coupled to the second reception circuit; and a third power device that is driven according to the third gate signal, the third power device coupled to the third reception circuit.

In the switching system according to an aspect of the present disclosure, for example, the first power device may be a first bidirectional switch, the second power device may be a second bidirectional switch, and the third power device may be a third bidirectional switch.

In the switching system according to an aspect of the present disclosure, for example, the first insulator may divide the first modulated signal into a plurality of first modulated signals and isolatedly transmit the plurality of first modulated signals, the second insulator may divide the second modulated signal into a plurality of second modulated signals and isolatedly transmit the plurality of second modulated signals, and the third insulator may divide the third modulated signal into a plurality of third modulated signals and isolatedly transmit the plurality of third modulated signals.

Accordingly, for example, if two gate signals are generated based on two modulated signals into which one modulated signal is divided, two gate signals with the same waveform may be input to a bidirectional switch. As a result, switching characteristics can be improved, efficiency can be increased, and power consumption can be reduced.

In the switching system according to an aspect of the present disclosure, for example, the first reception circuit, the second reception circuit, the third reception circuit, the first power device, the second power device, and the third power device may be integrated.

The switching system according to an aspect of the present disclosure, for example, further may include a gallium nitride semiconductor layer. The gallium nitride semiconductor layer may include at least one of the signal transmission circuit, the first reception circuit, the second reception circuit, the third reception circuit, the first power device, the second power device, and the third power device.

Accordingly, thermal resistance can be increased. For example, when at least part of the switching system is integrated, stable operation is possible even at high thermal density.

For example, the switching system according to an aspect of the present disclosure may include: an integrated transmission circuit into which a plurality of signal transmission circuits including the signal transmission circuit are integrated; and an integrated power device into which a plurality of reception circuits including the first reception circuit, the second reception circuit, and the third reception circuit, and a plurality of power devices including the first power device, the second power device, and the third power device are integrated.

As a result of integrating the plurality of reception circuits and the plurality of power devices, the number of processes for coupling the plurality of reception circuits and the plurality of power devices together may be reduced. When the switching system is downsized, delay caused by a wiring distance can be reduced and the switching characteristics can be enhanced.

In the switching system according to an aspect of the present disclosure, for example, the integrated transmission circuit may include an integrated insulator into which the first insulator, the second insulator, and the third insulator are integrated.

The switching system according to an aspect of the present disclosure further comprising a printed board. For example, a printed board includes the integrated insulator.

Accordingly, an integrated insulator can be obtained at low cost.

In the switching system according to an aspect of the present disclosure, for example, the integrated insulator may be arranged in a board, and the integrated transmission circuit may be arranged on the board.

Accordingly, a small-sized switching system can be obtained.

In the switching system according to an aspect of the present disclosure, for example, the integrated insulator may be arranged between the integrated transmission circuit and the integrated power device.

Accordingly, a switching system that is resistant to noise and operates stably can be obtained.

For example, the switching system according to an aspect of the present disclosure may further include: a heat sink; and a board that is arranged on the heat sink, the board including a through hole. The integrated power device may be arranged in the through hole in contact with the heat sink.

Accordingly, thermal dissipation of the integrated power device can be enhanced, and stable operation is enabled even at an elevated temperature.

For example, a matrix converter according to an aspect of the present disclosure includes: an integrated transmission circuit into which at least three signal transmission circuits including the above-described signal transmission circuit are integrated; an integrated insulator into which at least nine insulators are integrated, each of which divides the modulated signal input from the signal transmission circuit into a plurality of signals and isolatedly transmits the plurality of signals; and an integrated power device into which at least 18 reception circuits and at least nine bidirectional switches are integrated. In the integrated power device, each of the at least 18 reception circuits demodulates the modulated signal input from the integrated insulator to generate a gate signal, and each of the nine bidirectional switches is driven according to two gate signals input from two reception circuits.

According to the above-described configuration, a matrix converter that is small in size and operates stably can be obtained.

Embodiments are described in detail below with reference to the drawings.

The embodiments described below are comprehensive and specific examples. The values, shapes, waveforms, materials, constituents, arrangement positions and coupling forms of the constituents, steps, order of the steps, and the like specified in the below-described embodiments are examples and are not intended to limit the present disclosure. Among the constituents in the embodiments, the constituents not mentioned in independent claims that indicate the most significant concepts are described as arbitrary constituents.

In the description of all the drawings below, the same reference numerals are given to the same or similar parts and overlapping explanation may be omitted.

[Underlying Knowledge Forming Basis of this Disclosure]

Viewpoints of the inventors of the present disclosure are described below.

A bidirectional switch is used in, for example, a matrix converter. The matrix converter is a power conversion circuit, which directly converts alternating current (AC) power into AC power with different amplitude or a different frequency. In the matrix converter, the bidirectional switches are arranged like a matrix.

Figure 9:
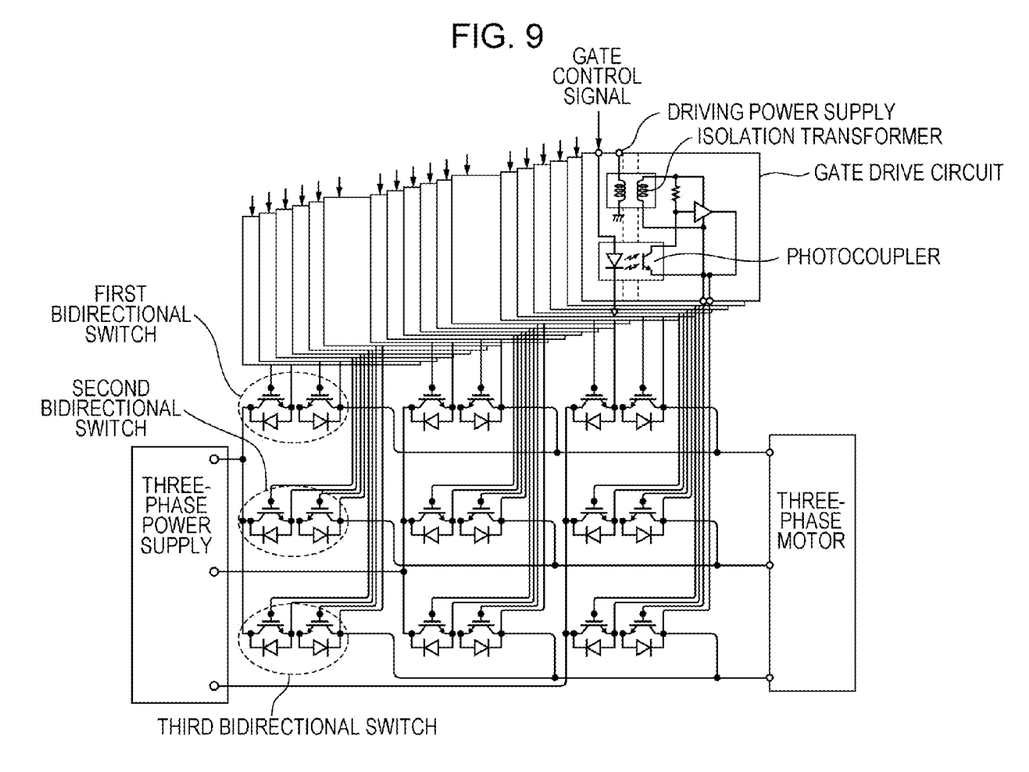
FIG. 9 is a block diagram illustrating a conventional three-phase matrix converter.

FIG. 9 illustrates a three-phase AC matrix converter system. The AC matrix converter illustrated in FIG. 9 is made up of nine bidirectional switches and 18 gate drive circuits. Each of the gate drive circuit includes an isolation transformer and a photocoupler. The AC matrix converter illustrated in FIG. 9 may generate an AC with a given frequency from a three-phase AC power supply and rotate a three-phase motor.

The bidirectional switch includes two gate terminals and two source terminals. For the on-off control of the bidirectional switch, for example, a positive gate voltage is applied to each of the gate terminals with respect to each of the source terminals. In the circuit in which the bidirectional switch is arranged, a potential of each source varies. Thus, each source is set in a floating state, where the source is insulated from other potentials in a direct current (DC) manner. That is, a secondary side of the gate drive circuit, from which a drive signal is output to a semiconductor switch, is insulated, in a DC manner, from a primary side of the gate drive circuit to which an input signal is input.

The conventional power conversion circuit uses many elements, the power conversion circuit has a complicated wiring configuration. In particular, the matrix converter includes a lot of gate control wiring. The increase in wiring may raise assembly cost. Besides, since a lot of wiring is arranged while ensuring high withstand voltage characteristics, the wiring may occupy a large area. If the wiring causes delay, operation may become unstable.

For the reasons, when the elements that configures the matrix converter are integrated, a small-sized and stable matrix converter can be obtained at low cost.

A conventional gate drive circuit is consistently supplied with power by an isolation transformer and the power is switched by a photocoupler. Accordingly, the conventional gate drive circuit needs much power supply and consumes a large amount of power.

Further, since the conventional gate drive circuit uses a transformer and a photocoupler, it is impossible to integrate the gate drive circuits. Thus, it is difficult to downsize the conventional gate drive circuit, and increase in a wiring distance may cause delay. As a result, the gate drive circuit is desired to address unstable operation, deterioration in switching characteristics, and/or low resistance to noise.

In contrast, the present inventors have conceived the present disclosure after consideration of a signal transmission circuit capable of reducing the power consumption and the size.

Embodiments

[Configuration]

A configuration example of the switching system according to an embodiment is described.

Figure 1:
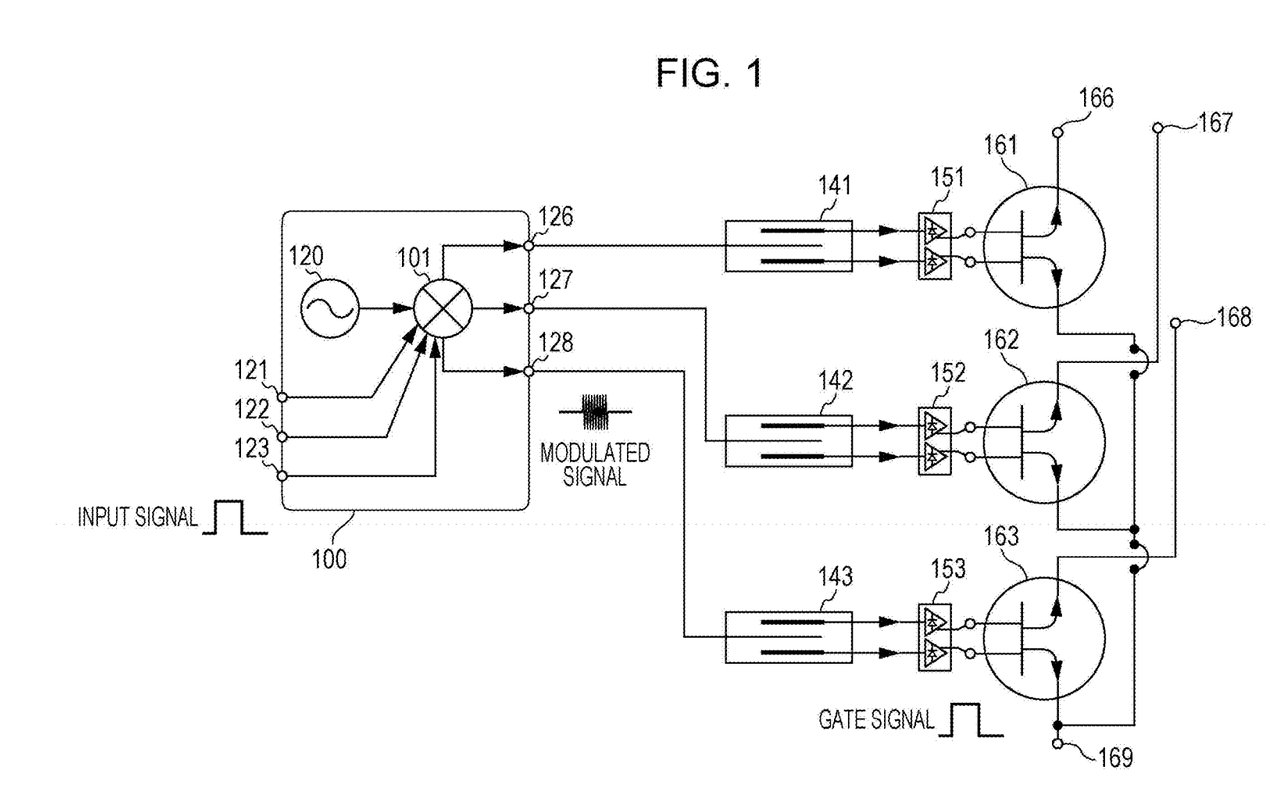
FIG. 1 is a block diagram illustrating a configuration example of a switching system.

FIG. 1 is a block diagram, which illustrates a configuration example of the switching system of the present embodiment. The switching system includes a signal transmission circuit 100, a first insulator 141, a second insulator 142, a third insulator 143, a first reception circuit 151, a second reception circuit 152, a third reception circuit 153, a first bidirectional switch 161, a second bidirectional switch 162, and a third bidirectional switch 163. The signal transmission circuit 100, the first insulator 141, and the first reception circuit 151 function as a gate drive circuit, which drives two gates of the first bidirectional switch 161. The signal transmission circuit 100, the second insulator 142, and the second reception circuit 152 function as a gate drive circuit, which drives two gates of the second bidirectional switch 162. The signal transmission circuit 100, the third insulator 143, and the third reception circuit 153 function as a gate drive circuit, which drives two gates of the third bidirectional switch 163.

The signal transmission circuit 100 includes a first input terminal 121, a second input terminal 122, a third input terminal 123, a first output terminal 126, a second output terminal 127, and a third output terminal 128. The signal transmission circuit 100 includes a high-frequency oscillation circuit 120 and a switching mixing circuit 101. The high-frequency oscillation circuit 120 generates a high-frequency wave. The "high-frequency wave" used herein denotes, for example, an electromagnetic wave with a frequency in a range from 1 MHz to 100 GHz inclusive. For example, the high-frequency wave has a frequency of 5 GHz. For example, the high-frequency wave is a sinusoidal high-frequency wave. For example, the sinusoidal high-frequency wave has a single frequency.

The high-frequency oscillation circuit 120 is coupled to the switching mixing circuit 101. The first input terminal 121, the second input terminal 122, and the third input terminal 123 are coupled to the switching mixing circuit 101 via, for example, wiring. The switching mixing circuit 101 is coupled to the first output terminal 126, the second output terminal 127, and the third output terminal 128.

The first output terminal 126 is coupled to the first insulator 141. The first insulator 141 is coupled to the first reception circuit 151. The first reception circuit 151 is coupled to the gates of the first bidirectional switch 161. The second output terminal 127 is coupled to the second insulator 142. The second insulator 142 is coupled to the second reception circuit 152. The second reception circuit 152 is coupled to the gates of the second bidirectional switch 162. The third output terminal 128 is coupled to the third insulator 143. The third insulator 143 is coupled to the third reception circuit 153. The third reception circuit 153 is coupled to the gates of the third bidirectional switch 163.

The first bidirectional switch 161 includes two gate terminals and two source terminals. While one of the source terminals of the first bidirectional switch 161 is coupled to a first terminal 166, the other source terminal of the first bidirectional switch 161 is coupled to a fourth terminal 169. The second bidirectional switch 162 includes two gate terminals and two source terminals. While one of the source terminals of the second bidirectional switch 162 is coupled to a second terminal 167, the other source terminal of the second bidirectional switch 162 is coupled to the fourth terminal 169. The third bidirectional switch 163 includes two gate terminals and two source terminals. While one of the source terminals of the third bidirectional switch 163 is coupled to a third terminal 168, the other source terminal is coupled to the fourth terminal 169.

The switching mixing circuit 101 mixes a high-frequency wave input from the high-frequency oscillation circuit 120 and a low-frequency input signal input from the first input terminal 121, the second input terminal 122, or the third input terminal 123, and then outputs the mixture. In other words, the switching mixing circuit 101 performs amplitude modulation on the high-frequency wave according to the low-frequency input signal input from the first input terminal 121, the second input terminal 122, or the third input terminal 123, and then outputs a modulated signal. The frequency of the high-frequency wave is, for example, 5 GHz.

When a first input signal is input from the first input terminal 121, a first modulated signal is output from the first output terminal 126. When a second input signal is input from the second input terminal 122, a second modulated signal is output from the second output terminal 127. When a third input signal is input from the third input terminal 123, a third modulated signal is output from the third output terminal 128. Each of the first insulator 141, the second insulator 142, and the third insulator 143 is an electromagnetic resonance coupler. The electromagnetic resonance coupler is an element, which outputs a signal input from the primary side to the secondary side. In the electromagnetic resonance coupler, signal wiring and reference ground wiring on the primary side are insulated, in a DC manner, from signal wiring and reference ground wiring on the secondary side, respectively.

Each of the first insulator 141, the second insulator 142, and the third insulator 143 divides a signal input from the primary side into two signals, and then outputs the two signals to the secondary side. Each of the first reception circuit 151, the second reception circuit 152, and the third reception circuit 153 rectifies high-frequency components of a modulated signal to direct current. In other words, when a modulated signal that contains a high-frequency component is input, each of the reception circuits detects an envelope of the amplitude. When a high-frequency signal, amplitude modulated signal, is input, each of the reception circuits outputs a waveform of a low frequency, which corresponds to the amplitude of the high-frequency signal.

The first bidirectional switch 161 may change a value of resistance between the first terminal 166 and the fourth terminal 169, or may be turned on or off. A gate voltage based on the first terminal 166 is applied to one of the gate terminals of the first bidirectional switch 161. A gate voltage based on the fourth terminal 169 is applied to the other gate terminal of the first bidirectional switch 161. The first bidirectional switch 161 is controlled according to the gate voltages. The second bidirectional switch 162 may change a value of resistance between the second terminal 167 and the fourth terminal 169, or may be turned on or off. A gate voltage based on the second terminal 167 is applied to one of the gate terminals of the second bidirectional switch 162. A gate voltage based on the fourth terminal 169 is applied to the other gate terminal of the second bidirectional switch 162. The second bidirectional switch 162 is controlled according to the gate voltages. The third bidirectional switch 163 may change a value of resistance between the third terminal 168 and the fourth terminal 169, or may be turned on or off. A gate voltage based on the third terminal 168 is applied to one of the gate terminals of the third bidirectional switch 163. A gate voltage based on the fourth terminal 169 is applied to the other gate terminal of the third bidirectional switch 163. The third bidirectional switch 163 is controlled according to the gate voltages.

The first reception circuit 151 is coupled to the gates of the first bidirectional switch 161. When a high-frequency wave is input to the first reception circuit 151, the first bidirectional switch 161 provides conduction between the first terminal 166 and the fourth terminal 169. A gallium nitride (GaN) semiconductor may be used for the signal transmission circuit 100, the first reception circuit 151, the second reception circuit 152, the third reception circuit 153, the first bidirectional switch 161, the second bidirectional switch 162, and the third bidirectional switch 163. A printed board may be used for the first insulator 141, the second insulator 142, and the third insulator 143.

[Operation]

Figure 2:
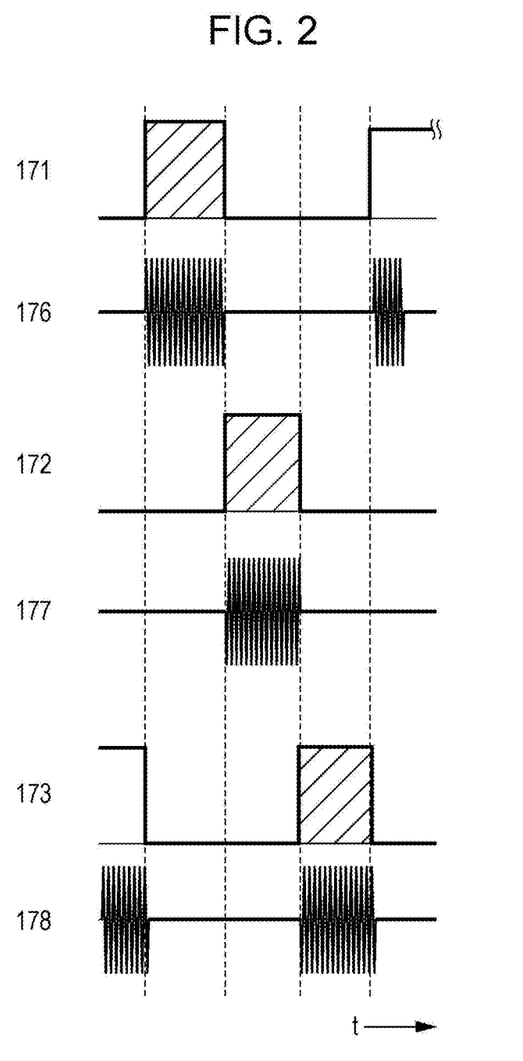
FIG. 2 is a diagram illustrating examples of temporal waveforms of input and output signals of a switching mixing circuit.
Figure 3:
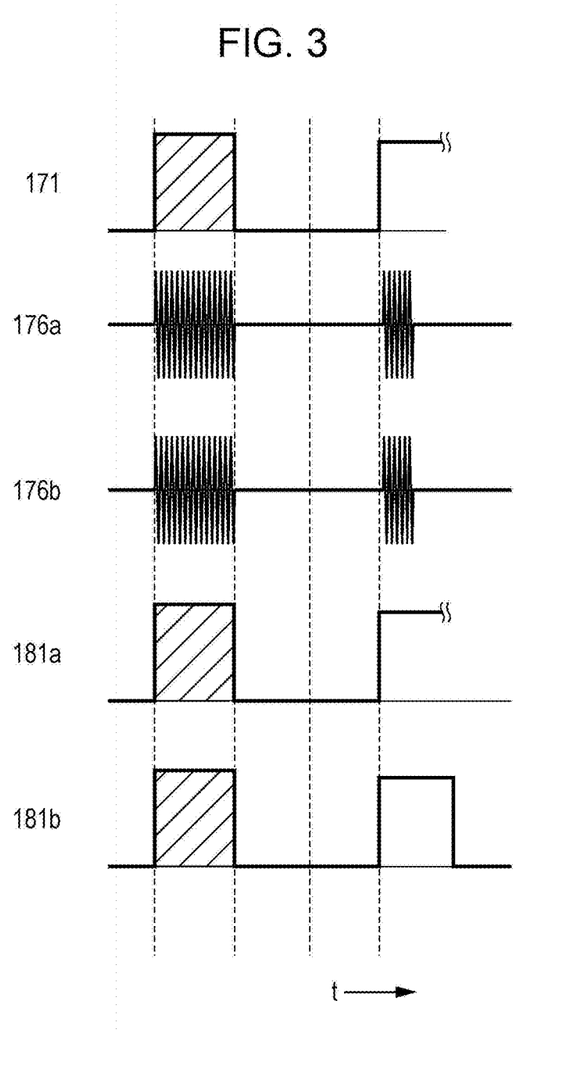
FIG. 3 is a diagram illustrating examples of temporal waveforms of input and output signals of a first reception circuit.

With reference to FIGS. 1 to 3, an example of overall operation of the switching system is described. FIG. 2 illustrates temporal waveforms of signals that are input to and output from the switching mixing circuit 101. FIG. 3 illustrates temporal waveforms of a first input signal 171 and signals input to and output from the first reception circuit 151.

When the first input signal 171 is input to the first input terminal 121, the first input signal 171 is input to the switching mixing circuit 101. A high-frequency wave from the high-frequency oscillation circuit 120 is input to the switching mixing circuit 101. The high-frequency wave has a frequency of, for example, 5 GHz. The switching mixing circuit 101 modulates the high-frequency wave according to the first input signal 171 to generate a first modulated signal 176, and then outputs the first modulated signal 176 to the first output terminal 126. FIG. 2 illustrates examples of temporal waveforms of the first input signal 171 and the first modulated signal 176.

The first modulated signal 176 output from the first output terminal 126 is input to the first insulator 141.

The first insulator 141 divides the first modulated signal 176 into a first modulated signal 176a and a first modulated signal 176b, and then outputs the first modulated signals 176a and 176b. FIG. 3 illustrates examples of temporal waveforms of the first modulated signals 176a and 176b that are output from the first insulator 141. The first insulator 141 is, for example, an electromagnetic resonance coupler. In this case, the primary side, which is the input side of the first insulator 141, and the secondary side, which is the output side of the first insulator 141, are insulated in a DC manner. In other words, in the first insulator 141, the signal wiring and the ground wiring on the primary side are insulated, in a DC manner, from the signal wiring and the ground wiring on the secondary side, respectively.

The two first modulated signals 176a and 176b output from the first insulator 141 are input to the first reception circuit 151. The first reception circuit 151 rectifies a high-frequency wave. The first reception circuit 151 rectifies the two first modulated signals 176a and 176b, and then outputs two first gate signals 181a and 181b. FIG. 3 illustrates examples of temporal waveforms of the first gate signals 181a and 181b output from the first reception circuit 151. For example, the first reception circuit 151 rectifies the first modulated signal 176a to generate the first gate signal 181a that has a waveform corresponding to an envelope of the amplitude of the first modulated signal 176a. The first gate signal 181a has a waveform equivalent to the waveform of the first input signal 171.

The first gate signal 181a generated by the first reception circuit 151 is input to one of the gates of the first bidirectional switch 161 while the first terminal 166 serves as a reference ground. The first gate signal 181b generated by the first reception circuit 151 is input to the other gate of the first bidirectional switch 161 while the fourth terminal 169 serves as a reference ground. When the first gate signals 181a and 181b are input to the two gates of the first bidirectional switch 161, the first bidirectional switch 161 is turned on and thereby provides conduction between the first terminal 166 and the fourth terminal 169.

In a case in which a second input signal 172 is input to the second input terminal 122 and in a case in which a third input signal 173 is input to the third input terminal 123, similar operations may be performed. When the second input signal 172 is input to the second input terminal 122, the second bidirectional switch 162 is turned on and thereby provides conduction between the second terminal 167 and the fourth terminal 169. When the third input signal 173 is input to the third input terminal 123, the third bidirectional switch 163 is turned on and thereby provides conduction between the third terminal 168 and the fourth terminal 169.

[Configuration of Switching Mixing Circuit 101]

The switching mixing circuit 101 is now described in detail.

Figure 4:
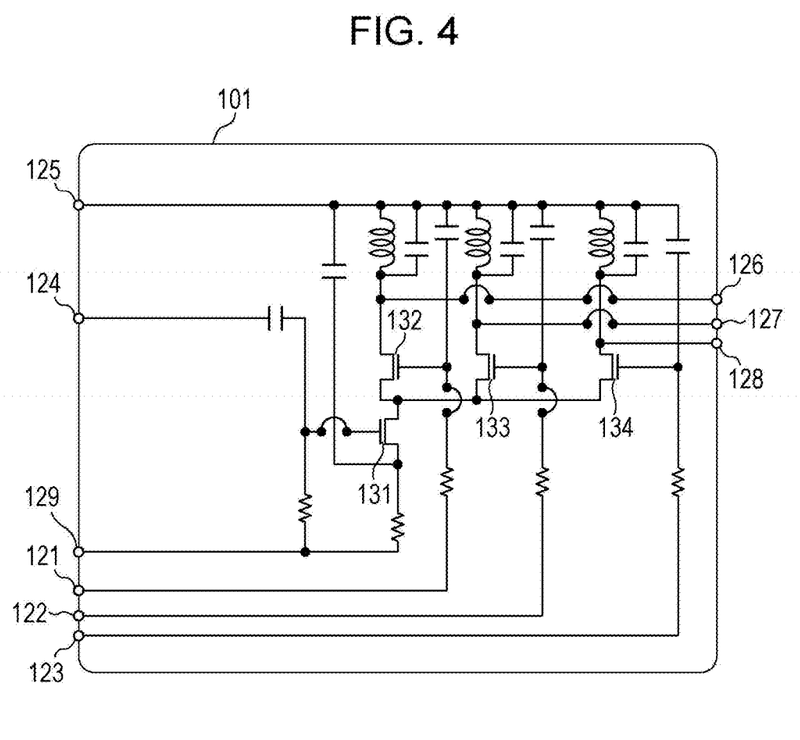
FIG. 4 is a circuit diagram illustrating a specific example of the switching mixing circuit.

The switching mixing circuit 101 includes one high-frequency input terminal 124, three control input terminals, and three output terminals. The switching mixing circuit 101 outputs three modulated signals, which originate from one high-frequency wave, by selecting one output terminal from the three output terminals and switching the output terminal to be selected. FIG. 4 illustrates a specific example of the switching mixing circuit 101.

The switching mixing circuit 101 illustrated in FIG. 4 includes the high-frequency input terminal 124, a power-supply terminal 125, a ground terminal 129, the first input terminal 121, the second input terminal 122, the third input terminal 123, the first output terminal 126, the second output terminal 127, the third output terminal 128, a first transistor 131, a second transistor 132, a third transistor 133, and a fourth transistor 134.

A drain of the second transistor 132 is coupled to the first output terminal 126. A drain of the third transistor 133 is coupled to the second output terminal 127. A drain of the fourth transistor 134 is coupled to the third output terminal 128. The drain of the second transistor 132 is further coupled to the power-supply terminal 125 via a first bias circuit. The drain of the third transistor 133 is further coupled to the power-supply terminal 125 via a second bias circuit. The drain of the fourth transistor 134 is further coupled to the power-supply terminal 125 via a third bias circuit. Each of the bias circuits includes an inductor. A source of the second transistor 132 is coupled to a drain of the first transistor 131. A source of the third transistor 133 is coupled to the drain of the first transistor 131. A source of the fourth transistor 134 is coupled to a drain of the first transistor 131. A gate of the second transistor 132 is coupled to the first input terminal 121 via a resistor. A gate of the third transistor 133 is coupled to the second input terminal 122 via a resistor. A gate of the fourth transistor 134 is coupled to the third input terminal 123 via a resistor.

A gate of the first transistor 131 is coupled to the high-frequency input terminal 124, and a source of the first transistor 131 is coupled to the ground terminal 129. Each of the first transistor 131, the second transistor 132, the third transistor 133, and the fourth transistor 134 is a depletion type and normally-on type GaN field effect transistor for example.

[Operation of Switching Mixing Circuit 101]

In the switching mixing circuit 101, a power-supply voltage is applied to the power-supply terminal 125 with reference to the ground terminal 129. A high-frequency wave, which is a continuous wave, is input to the high-frequency input terminal 124. The first input signal 171 is input to the first input terminal 121, the second input signal 172 is input to the second input terminal 122, and the third input signal 173 is input to the third input terminal 123. The high-frequency wave input from the high-frequency input terminal 124 is input to the gate of the first transistor 131. Accordingly, the first transistor 131 is turned on or off, depending on the amplitude of the high-frequency wave input to the gate of the first transistor 131. In other words, the first transistor 131 amplifies the high-frequency wave input from the high-frequency input terminal 124 and then outputs the amplified high-frequency wave from the drain of the first transistor 131.

Each of the second transistor 132, the third transistor 133, and the fourth transistor 134 serves as a switch. When a voltage is applied to the first input terminal 121, the second transistor 132 is turned on and thereby provides conduction between the first output terminal 126 and the drain of the first transistor 131. At this time, the high-frequency wave amplified by the first transistor 131 is output from the first output terminal 126 through the second transistor 132. The high-frequency wave output from the first output terminal 126 constitutes the first modulated signal 176. Operations of the third transistor 133 and the fourth transistor 134 may be described similarly.

FIG. 2 illustrates temporal waveforms of the first input signal 171, the first modulated signal 176, the second input signal 172, a second modulated signal 177, the third input signal 173, and a third modulated signal 178. When the first input signal 171 is input to the first input terminal 121, the first modulated signal 176 is output from the first output terminal 126. When the second input signal 172 is input from the second input terminal 122, the second modulated signal 177 is output from the second output terminal 127. When the third input signal 173 is input from the third input terminal 123, the third modulated signal 178 is output from the third output terminal 128.

As illustrated in FIG. 2, while one of the first input signal 171, the second input signal 172, and the third input signal 173 is input, the other two signals are not input. In other words, a timing at which the first input signal 171 is input, a timing at which the second input signal 172 is input, and a timing at which the third input signal 173 is input are mutually exclusive. For example, while the first input signal 171 is input, the second input signal 172 and the third input signal 173 are not input.

In a 3×3 matrix converter, for example, when two or more of three bidirectional switches coupled to one common terminal of a three-phase power supply are turned on at the same time, a feedthrough current may break a circuit element or a motor. In contrast, since the switching mixing circuit 101 outputs three modulated signals, which are mutually exclusive, the switching mixing circuit 101 is applicable to a 3×3 matrix converter for example.

The switching mixing circuit 101 outputs a high-frequency wave from only one of the three output terminals. When "a high-frequency wave is not output" or "a modulated signal is not output" from an output terminal noted, the ratio of the strength of the output from another output terminal to the strength of the output from the noted output terminal indicates 10 dB or more. That is, in the present disclosure, the expression "a modulated signal is not output" is defined as satisfying this relation. In contrast, "a high-frequency wave is output" or "a modulated signal is output" from the noted output terminal, the ratio of the strength of the output from the noted output terminal to the strength of the output from another output terminal indicates 10 dB or more. That is, in the present disclosure, the expression "a modulated signal is output" is defined as satisfying this relation.

Figure 5:
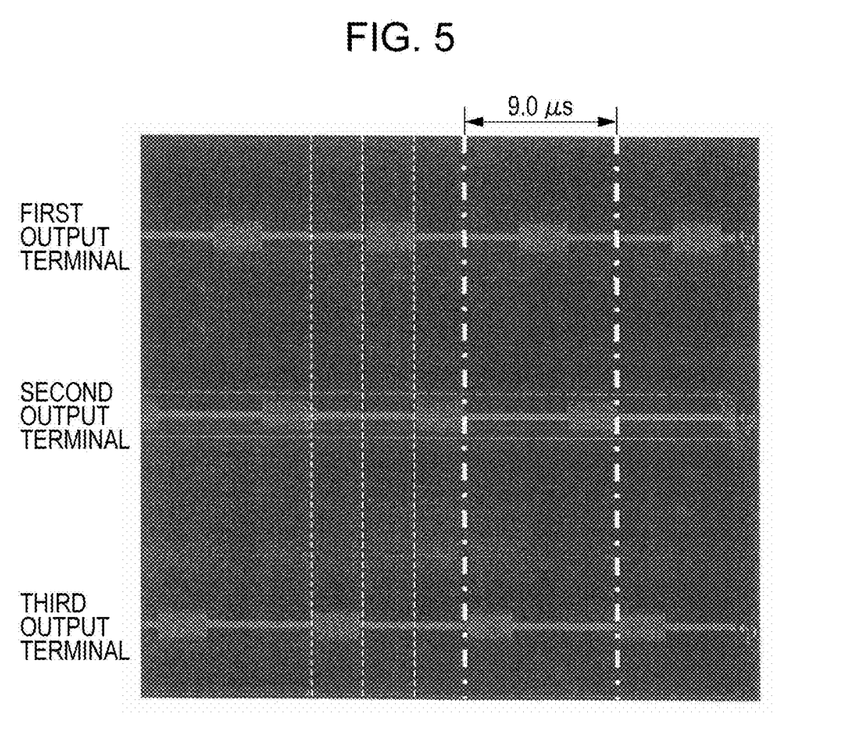
FIG. 5 is a diagram illustrating temporal waveforms of modulated signals according to an embodiment of a signal transmission circuit.

FIG. 5 illustrates temporal waveforms of the modulated signals output from the respective output terminals in an embodiment of the signal transmission circuit 100. As illustrated in FIG. 5, the output from the first output terminal 126, the output from the second output terminal 127, and the output from the third output terminal 128 are mutually exclusive.

The signal transmission circuit 100 can produce three control signals from one high-frequency wave through such exclusive output operations. That is, one high-frequency oscillation circuit, which is the high-frequency oscillation circuit 120, is sufficient for three control signals. As a result, the signal transmission circuit 100, a gate drive circuit, and a power switching system with small power consumption may be obtained.

The signal transmission circuit 100 may be configured as, for example, one chip. Accordingly, the signal transmission circuit 100 that outputs three modulated signals can be made small in size. Integration of the signal transmission circuit 100 can decrease an area for wiring and reduce assembly cost for coupling wiring or the like. Further, signal delay caused by each wiring distance can be avoided, and thus modulated signals can be generated at coherent timings. When the signal transmission circuit 100 described above is applied to, for example, the switching system illustrated in FIG. 1, a power device, such as a bidirectional switch, can be efficiently driven and switching characteristics can be enhanced.

In a conventional gate drive circuit, three insulation power supplies are arranged and power is consistently supplied through three systems so as to generate three gate signals. In contrast, the signal transmission circuit 100 according to the present embodiment may use power of one power supply, which is allocated to each of the three gate signals, or, to be precise, the three modulated signals from which the three gate signals originate. That is, in the signal transmission circuit 100, when one gate signal is in the OFF state, the power is used for another gate signal in the ON state. Thus, the power for the signal transmission circuit 100 can be reduced to approximately one third, and thus efficiency can increase.

A conventional switching system, which includes three bidirectional switches, is provided with six insulation power supplies so as to drive the three bidirectional switches. In contrast, when each insulator divides a modulated signal into two signals and then outputs the two signals as illustrated in FIG. 1, the signal transmission circuit 100 according to the present embodiment may drive three bidirectional switches with one power supply. As a result, the power consumption of the switching system that includes the signal transmission circuit 100 may be made approximately one sixth.

In a conventional gate drive circuit, an isolation transformer and a photocoupler are arranged separately. In contrast, when each insulator is an electromagnetic resonance coupler in the switching system according to the present embodiment, the system may be made small in size.

In the switching system according to the present embodiment, there is almost no occurrence of delay among a plurality of signals or a timing lag. Thus, for example, the switching system according to the present embodiment may implement a matrix converter, which operates without dead time.

Further, when the switching system according to the present embodiment includes a bidirectional switch, for example, the switching system may implement a matrix converter, which includes no free-wheeling diode.

When the insulator in the switching system according to the present embodiment is an electromagnetic resonance coupler, at least one of reduction in wiring, drop in cost due to the decreased number of processes for coupling wiring, downsizing due to reduction in wiring area, increase in speed due to reduction in wiring delay may be achieved.

[Matrix Converter]

Figure 6:
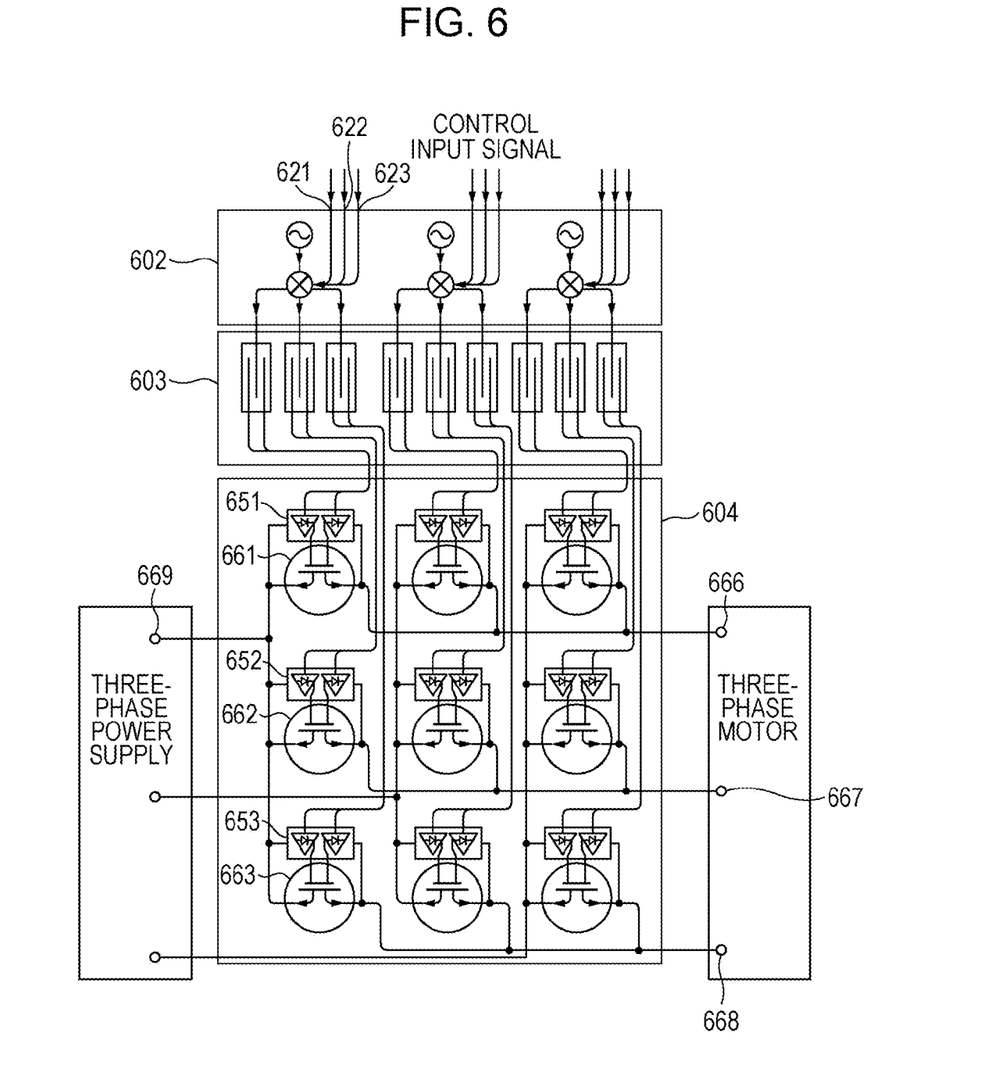
FIG. 6 is a block configuration diagram illustrating a configuration example of a three-phase alternating current (AC) matrix converter system.

FIG. 6 illustrates an example of a three-phase AC matrix converter system, which includes the signal transmission circuit according to the present embodiment.

The three-phase AC matrix converter system illustrated in FIG. 6 is made up of an integrated transmission circuit 602, an integrated insulator 603, and an integrated power device 604. A plurality of signal transmission circuits including the signal transmission circuit according to the present embodiment are integrated into the integrated transmission circuit 602. The integrated transmission circuit 602 includes, for example, a first input terminal 621, a second input terminal 622, and a third input terminal 623. The integrated insulator 603 isolatedly transmits a modulated signal. For example, resonance couplers are integrated into the integrated insulator 603. Reception circuits, which each rectify the modulated signal to generate a gate signal, and bidirectional switches, which each are driven according to the gate signal, are integrated into the integrated power device 604. The three-phase AC matrix converter is supplied with power from a three-phase power supply via a fourth terminal 669. An output of the three-phase AC matrix converter is supplied to a first terminal 666, a second terminal 667, and a third terminal 668 of a three-phase motor.

The integrated transmission circuit 602 outputs nine high-frequency signals. The integrated transmission circuit 602 is made up of, for example, three signal transmission circuits, each of which is the signal transmission circuit 100 in FIG. 1. The integrated insulator 603 is made up of, for example, nine electromagnetic resonance couplers. Each of the electromagnetic resonance couplers receives one modulated signal and then outputs two high-frequency signals. The integrated power device 604 includes nine units, each of which is a combination of the bidirectional switch and the reception circuit. The integrated power device 604 includes a first bidirectional switch 661, a second bidirectional switch 662, a third bidirectional switch 663, a first reception circuit 651, a second reception circuit 652, and a third reception circuit 653. According to the above-described configuration, a matrix converter, which is very small in size, can be obtained.

Figure 7:
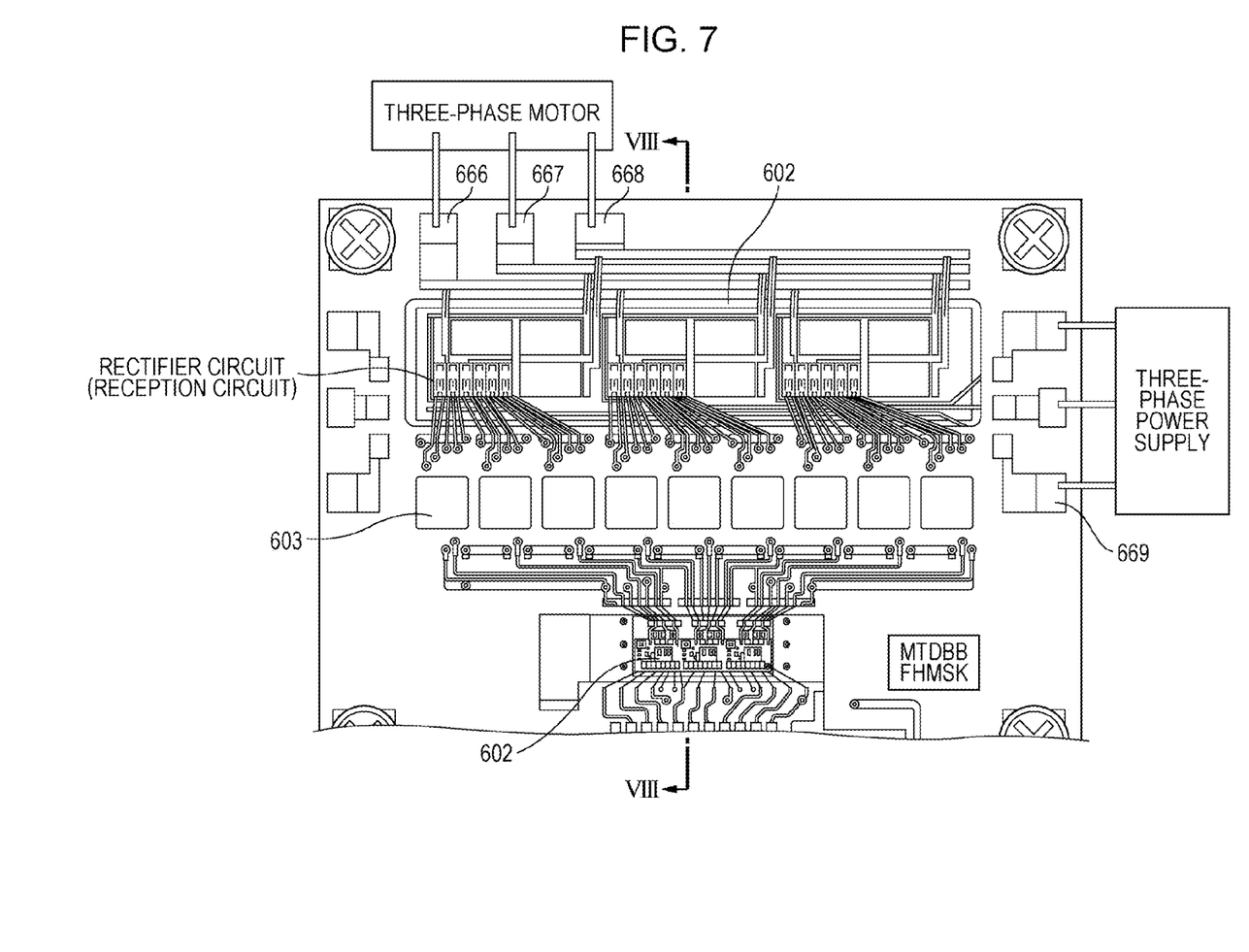
FIG. 7 is a top view illustrating a specific example of the three-phase AC matrix converter system.
Figure 8:
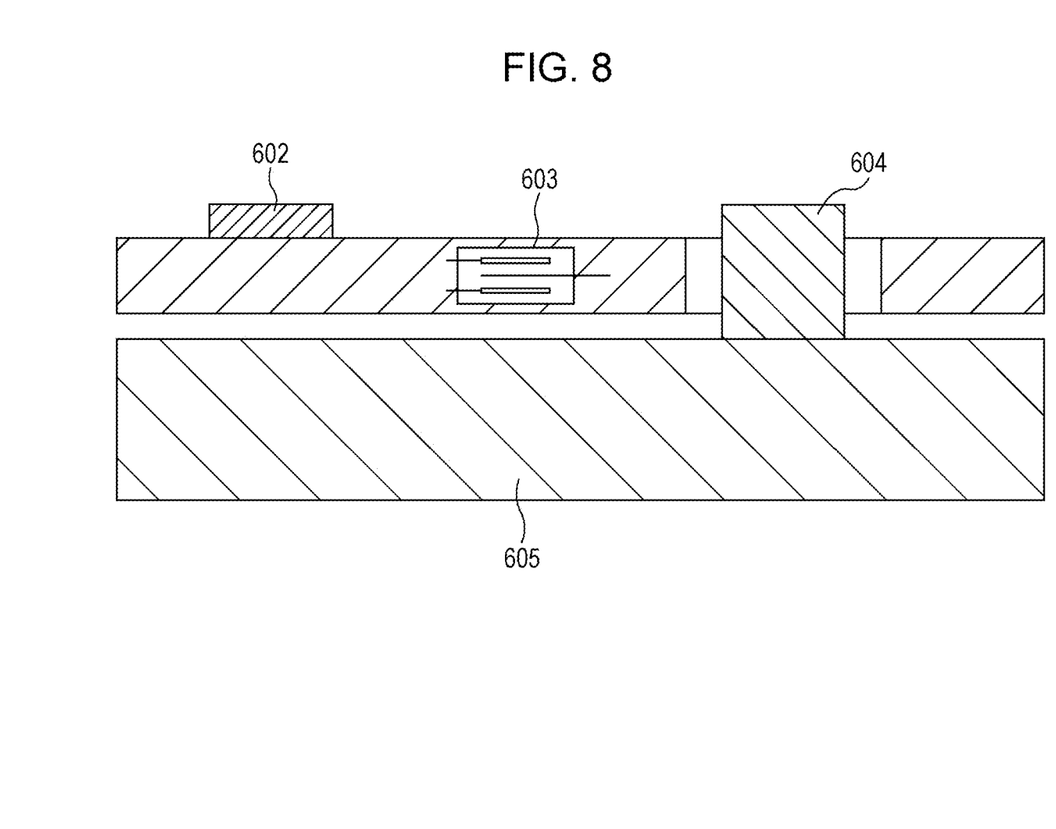
FIG. 8 is a cross-sectional view along line VIII-VIII in FIG. 7.

FIG. 7 is a top view, which illustrates a specific example of the three-phase AC matrix converter system in FIG. 9. FIG. 8 is a cross-sectional schematic diagram along line VIII-VIII in FIG. 7.

A printed board is arranged over a heat sink 605. The integrated insulator 603 is arranged in the printed board. The integrated transmission circuit 602 is mounted on the printed board. A hole is formed through part of the printed board toward the heat sink 605. The integrated power device 604 is arranged in the hole and is in contact with the heat sink 605. The integrated insulator 603 is arranged between the integrated power device 604 and the integrated transmission circuit 602. Since the above-described arrangement may divide an area into a high-frequency area and a low-frequency area, a matrix converter system, which stably operates, may be obtained.

For example, the integrated transmission circuit 602 may be placed over the integrated insulator 603.

The switching system that includes the resonance coupler according to the present embodiment is not limited to the above-described switching system. For example, the switching system may be another matrix converter, or a power conversion device. The power conversion device may be, for example, a two-phase to three-phase conversion system, a single-phase to three-phase conversion system, or a two-phase to two-phase conversion system.

The switching mixing circuit 101 may include at least one input terminal. For example, the switching mixing circuit 101 may have only one input terminal. In this case, the switching mixing circuit 101 may generate the first input signal 171, the second input signal 172, and the third input signal 173 by, for example, shifting each timing to modulate the high-frequency wave of the input signal input from the input terminal.

Dead time, during which a signal is input to neither one of the first input terminal 121, the second input terminal 122, or the third input terminal 123, may be set for at least one of a period during which the first input signal 171 is input to the first input terminal 121, a period during which the second input signal 172 is input to the second input terminal 122, and a period during which the third input signal 173 is input to the third input terminal 123.

A period during which a signal is output from neither one of the first output terminal 126, the second output terminal 127, or the third output terminal 128 may be further set in addition to a period during which the first modulated signal 176 is output from the first output terminal 126, a period during which the second modulated signal 177 is output from the second output terminal 127, and a period during which the third modulated signal 178 is output from the third output terminal 128.

Each of the first transistor 131, the second transistor 132, and the third transistor 133 may be a normally-off type transistor.

A semiconductor other than a gallium nitride (GaN) semiconductor may be used for at least one of the signal transmission circuit 100, the first reception circuit 151, the second reception circuit 152, the third reception circuit 153, the first bidirectional switch 161, the second bidirectional switch 162, and the third bidirectional switch 163. The first insulator 141, the second insulator 142, and the third insulator 143 may be arranged in a board other than a printed board. The first insulator 141, the second insulator 142, and the third insulator 143 may be arranged in a board of, for example, ceramic, multilayer dielectric, a semiconductor, or the like. It is not compulsory for the first insulator 141, the second insulator 142, and the third insulator 143 to be electromagnetic resonance couplers. The first insulator 141, the second insulator 142, and the third insulator 143 may be capacity couplers or transformers for example. It is not compulsory for the first insulator 141, the second insulator 142, and the third insulator 143 to divide the modulated signal that has been input and to output the resultant signals. The first insulator 141, the second insulator 142, and the third insulator 143 may divide the modulated signal that has been input into three or more signals. Instead of the first bidirectional switch 161, the second bidirectional switch 162, and the third bidirectional switch 163, a first unidirectional switch, a second unidirectional switch, and a third unidirectional switch may be arranged.

For example, the frequency of the high-frequency wave may be an arbitrary value between a few MHz and 100 GHz. As the frequency of the high-frequency wave increases, the size of the system can decrease.

The present disclosure is not limited to the embodiments described above or variations thereof. An embodiment in which various changes that those skilled in the art may hit upon are added to the present embodiment and the variations thereof, and another embodiment in which a constituent of a different embodiment or the variations thereof is combined are also included in the scope of the present disclosure as long as these embodiments fall within the true spirit of the present disclosure.

For example, the present disclosure may be utilized for a power converter, such as a matrix converter, or a power system.

What is claimed is:

1. A signal transmission circuit comprising:
   at least one input terminal to which at least one input signal is input;
   a high-frequency oscillation circuit that outputs a high-frequency wave;
   a switching mixing circuit that modulates the high-frequency wave according to the at least one input signal to generate a plurality of modulated signals including a first modulated signal, a second modulated signal, and a third modulated signal;
   a first output terminal from which the first modulated signal is output;
   a second output terminal from which the second modulated signal is output; and
   a third output terminal from which the third modulated signal is output, wherein
   while the first modulated signal is output from the first output terminal, the second modulated signal and the third modulated signal are not output,
   while the second modulated signal is output from the second output terminal, the first modulated signal and the third modulated signal are not output, and
   while the third modulated signal is output from the third output terminal, the first modulated signal and the second modulated signal are not output.

2. The signal transmission circuit according to claim 1, wherein the high-frequency wave is a high-frequency sinusoidal wave.

3. The signal transmission circuit according to claim 1, further comprising:
   a first insulator that isolatedly transmits the first modulated signal, the first insulator coupled to the first output terminal;
   a second insulator that isolatedly transmits the second modulated signal, the second insulator coupled to the second output terminal; and
   a third insulator that isolatedly transmits the third modulated signal, the third insulator coupled to the third output terminal.

4. The signal transmission circuit according to claim 3, wherein
   the first insulator is a first electromagnetic resonance coupler,
   the second insulator is a second electromagnetic resonance coupler, and
   the third insulator is a third electromagnetic resonance coupler.

5. A switching system comprising:
   the signal transmission circuit according to claim 3;
   a first reception circuit that demodulates the first modulated signal received from the first insulator to generate a first gate signal, the first reception circuit coupled to the first insulator;
   a second reception circuit that demodulates the second modulated signal received from the second insulator to generate a second gate signal, the second reception circuit coupled to the second insulator;
   a third reception circuit that demodulates the third modulated signal received from the third insulator to generate a third gate signal, the third reception circuit coupled to the third insulator;
   a first power device that is driven according to the first gate signal, the first power device coupled to the first reception circuit;
   a second power device that is driven according to the second gate signal, the second power device coupled to the second reception circuit; and
   a third power device that is driven according to the third gate signal, the third power device coupled to the third reception circuit.

6. The switching system according to claim 5, wherein
   the first power device is a first bidirectional switch,
   the second power device is a second bidirectional switch, and
   the third power device is a third bidirectional switch.

7. The switching system according to claim 5, wherein
   the first insulator divides the first modulated signal into a plurality of first modulated signals and isolatedly transmits the plurality of first modulated signals,
   the second insulator divides the second modulated signal into a plurality of second modulated signals and isolatedly transmits the plurality of second modulated signals, and
   the third insulator divides the third modulated signal into a plurality of third modulated signals and isolatedly transmits the plurality of third modulated signals.

8. The switching system according to claim 5, wherein the first reception circuit, the second reception circuit, the third reception circuit, the first power device, the second power device, and the third power device are integrated.

9. The switching system according to claim 5, further comprising a gallium nitride semiconductor layer,
   wherein the gallium nitride semiconductor layer includes at least one of the signal transmission circuit, the first reception circuit, the second reception circuit, the third reception circuit, the first power device, the second power device, and the third power device.

10. The switching system according to claim 5, comprising:
    an integrated transmission circuit into which a plurality of signal transmission circuits including the signal transmission circuit are integrated; and an integrated power device into which a plurality of reception circuits including the first reception circuit, the second reception circuit, and the third reception circuit, and a plurality of power devices including the first power device, the second power device, and the third power device are integrated.

11. The switching system according to claim 10, wherein the integrated transmission circuit includes an integrated insulator into which the first insulator, the second insulator, and the third insulator are integrated.

12. The switching system according to claim 11, further comprising a printed board,
wherein the printed board includes the integrated insulator.

13. The switching system according to claim 11, wherein the integrated insulator is arranged in a board, and
the integrated transmission circuit is arranged on the board.

14. The switching system according to claim 11, wherein the integrated insulator is arranged between the integrated transmission circuit and the integrated power device.

15. The switching system according to claim 10, further comprising:
a heat sink; and
a board that is arranged on the heat sink, the board including a through hole, wherein
the integrated power device is arranged in the through hole in contact with the heat sink.

16. The signal transmission circuit according to claim 1, wherein
the at least one input signal includes a first input signal, a second input signal, and a third input signal, and
the at least one input terminal includes a first input terminal to which the first input signal is input, a second input terminal to which the second input signal is input, and a third input terminal to which the third input signal is input,
the switching mixing circuit
modulates the high-frequency wave according to the first input signal to generate the first modulated signal,
modulates the high-frequency wave according to the second input signal to generate the second modulated signal, and
modulates the high-frequency wave according to the third input signal to generate the third modulated signal.

17. The signal transmission circuit according to claim 16, wherein
while the first input signal is input from the first input terminal, a signal is input to neither the second input terminal nor the third input terminal,
while the second input signal is input from the second input terminal, a signal is input to neither the first input terminal nor the third input terminal, and
while the third input signal is input from the third input terminal, a signal is input to neither the first input terminal nor the second input terminal.

18. The signal transmission circuit according to claim 1, wherein
the switching mixing circuit includes:
a high-frequency input terminal to which the high-frequency wave is input from the high-frequency oscillation circuit;
a power-supply terminal from which a power-supply potential is applied;
a ground terminal from which a ground potential is applied;
a first transistor that includes a first gate terminal coupled to the high-frequency input terminal, a first source terminal coupled to the ground terminal, and a first drain terminal;
a second transistor that includes a second gate terminal coupled to a first input terminal included in the at a least one input terminal, a second source terminal coupled to the first drain terminal of the first transistor, and a second drain terminal coupled to the first output terminal and the power-supply terminal;
a third transistor that includes a third gate terminal coupled to a second input terminal included in the at a least one input terminal, a third source terminal coupled to the first drain terminal of the first transistor, and a third drain terminal coupled to the second output terminal and the power-supply terminal; and
a fourth transistor that includes a fourth gate terminal coupled to a third input terminal included in the at a least one input terminal, a fourth source terminal coupled to the first drain terminal of the first transistor, and a fourth drain terminal coupled to the third output terminal and the power-supply terminal.

19. A matrix converter comprising:
an integrated transmission circuit into which at least three signal transmission circuits including the signal transmission circuit according to claim 1 are integrated;
an integrated insulator into which at least nine insulators are integrated, each of the at least nine insulators dividing the modulated signal input from the signal transmission circuit into a plurality of signals and isolatedly transmitting the plurality of signals; and
an integrated power device into which at least 18 reception circuits and at least nine bidirectional switches are integrated, each of the at least 18 reception circuits demodulating the modulated signal input from the integrated insulator to generate a gate signal, each of the nine bidirectional switches being driven according to two gate signals input from two reception circuits.

* * * * *